United States Patent
Breinlinger et al.

(10) Patent No.: US 10,006,938 B2
(45) Date of Patent: Jun. 26, 2018

(54) PROBES WITH PROGRAMMABLE MOTION

(71) Applicant: FormFactor, Inc., Livermore, CA (US)

(72) Inventors: Keith J. Breinlinger, Livermore, CA (US); Kevin J. Hughes, Livermore, CA (US); Russell Newstrom, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 197 days.

(21) Appl. No.: 13/732,922

(22) Filed: Jan. 2, 2013

(65) Prior Publication Data

US 2013/0169301 A1    Jul. 4, 2013

Related U.S. Application Data

(60) Provisional application No. 61/583,154, filed on Jan. 4, 2012.

(51) Int. Cl.
  *G01R 1/067* (2006.01)
  *G01R 1/073* (2006.01)

(52) U.S. Cl.
  CPC ....... *G01R 1/06705* (2013.01); *G01R 1/0675* (2013.01); *G01R 1/07314* (2013.01); *G01R 1/07357* (2013.01)

(58) Field of Classification Search
  CPC .................................. G01R 1/06705
  USPC .................................. 324/750.24
  See application file for complete search history.

(56) References Cited

U.S. PATENT DOCUMENTS

| 7,190,179 | B2 * | 3/2007 | Haga | C22C 19/03 |
| | | | | 324/755.05 |
| 7,619,430 | B2 | 11/2009 | Jeon et al. | |
| 7,775,804 | B2 * | 8/2010 | Neidich | H01R 13/2428 |
| | | | | 439/66 |
| 7,850,460 | B2 * | 12/2010 | Weiland | G01R 1/06733 |
| | | | | 439/66 |
| 7,866,986 | B2 * | 1/2011 | Rikimaru | G01R 1/06722 |
| | | | | 439/65 |
| 7,960,989 | B2 | 6/2011 | Breinlinger et al. | |
| 2007/0257685 | A1 * | 11/2007 | Mochizuki | G01R 1/06705 |
| | | | | 324/755.07 |
| 2009/0144971 | A1 * | 6/2009 | Takekoshi | G01R 1/06722 |
| | | | | 29/846 |
| 2010/0231249 | A1 * | 9/2010 | Dang et al. | 324/758 |

FOREIGN PATENT DOCUMENTS

| JP | 2006-078495 | 3/2006 |
| KR | 10-2011-0119498 | 11/2011 |

OTHER PUBLICATIONS

PCT/US2013/020093, International Search Report and Written Opinion of the International Searching Authority (dated Apr. 26, 2013), 9 pages.

* cited by examiner

*Primary Examiner* — Paresh Patel
(74) *Attorney, Agent, or Firm* — Lumen Patent Firm

(57) ABSTRACT

The elongated body of an electrically conductive contact probe can be disposed in a guide hole and can include a patterned region for engaging and riding on a contact region of an inner sidewall of the guide hole as the elongated body moves in the guide hole in response to a force on a tip of the probe. As the patterned region rides the contact region, the tip moves in a lateral pattern that is a function of the surface(s) of the patterned region.

35 Claims, 14 Drawing Sheets

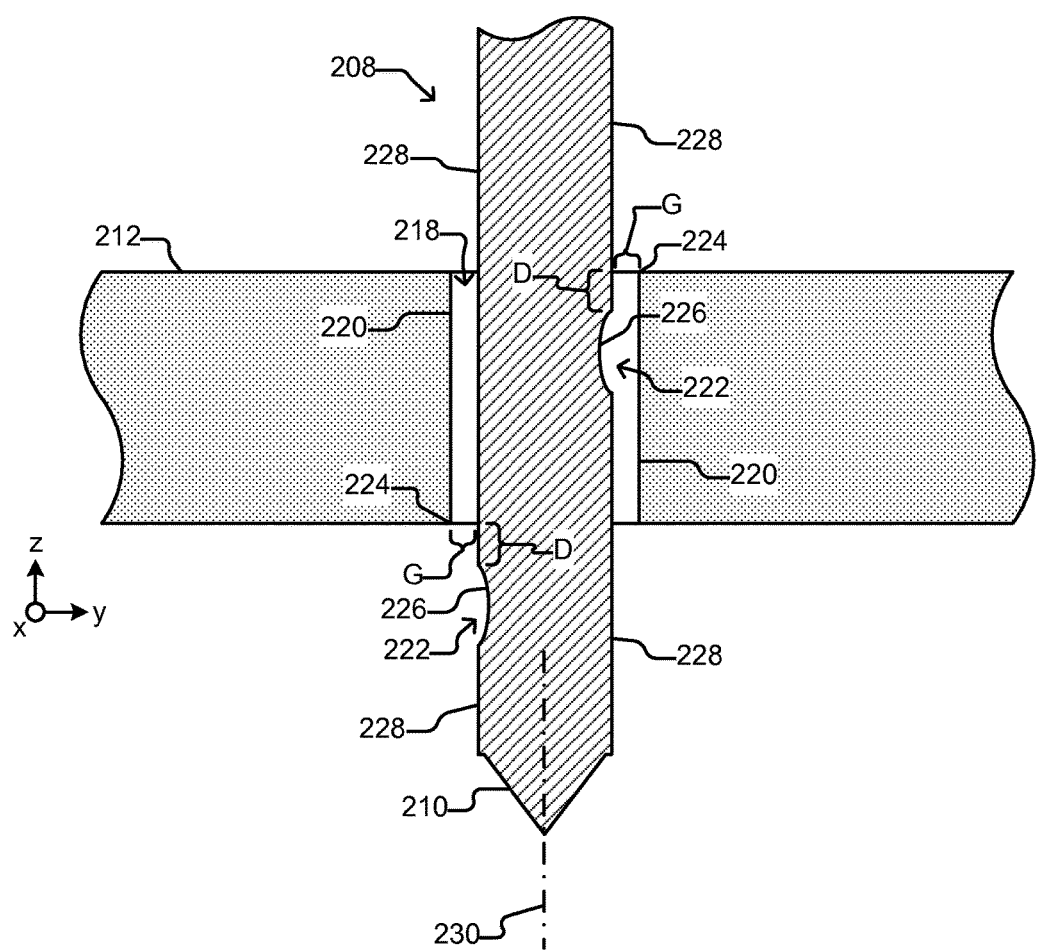

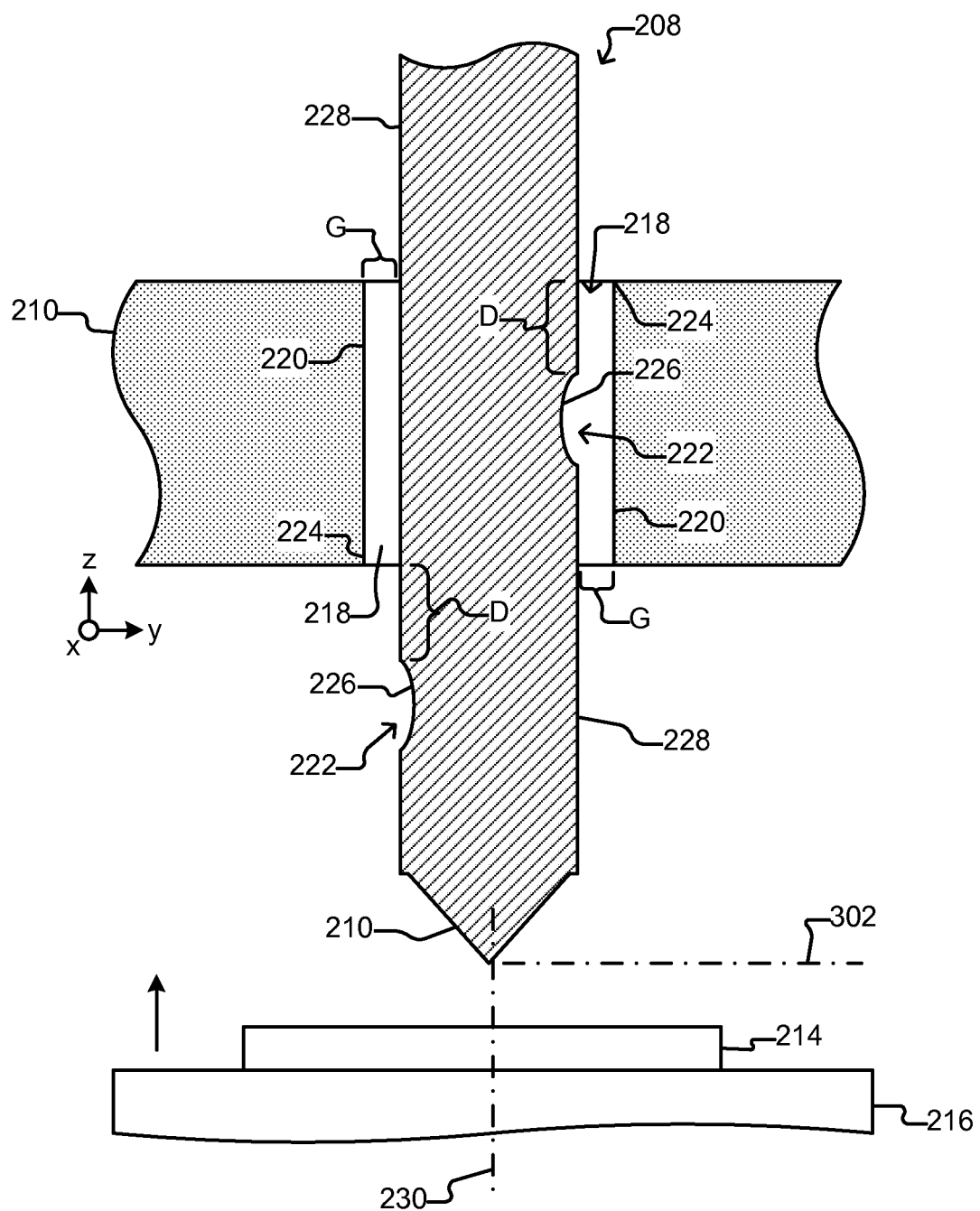

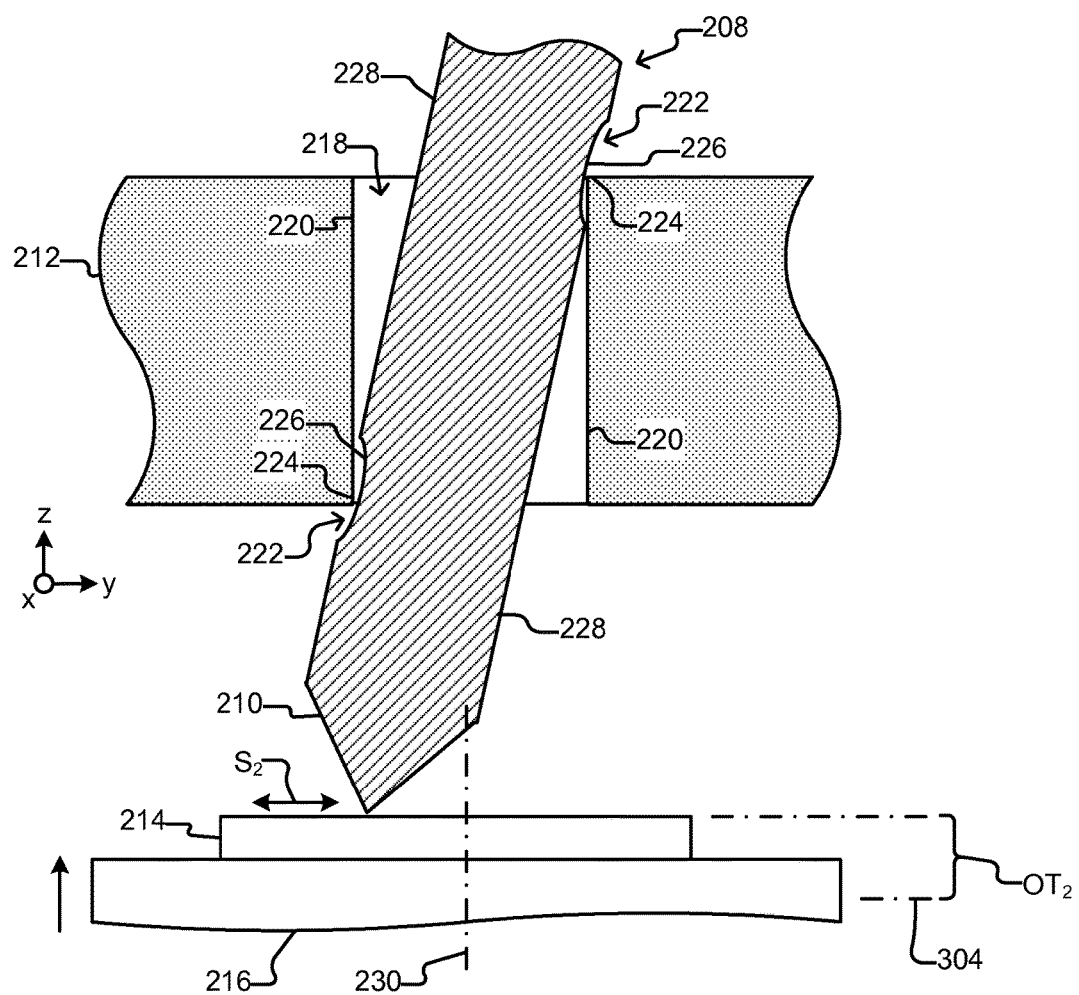

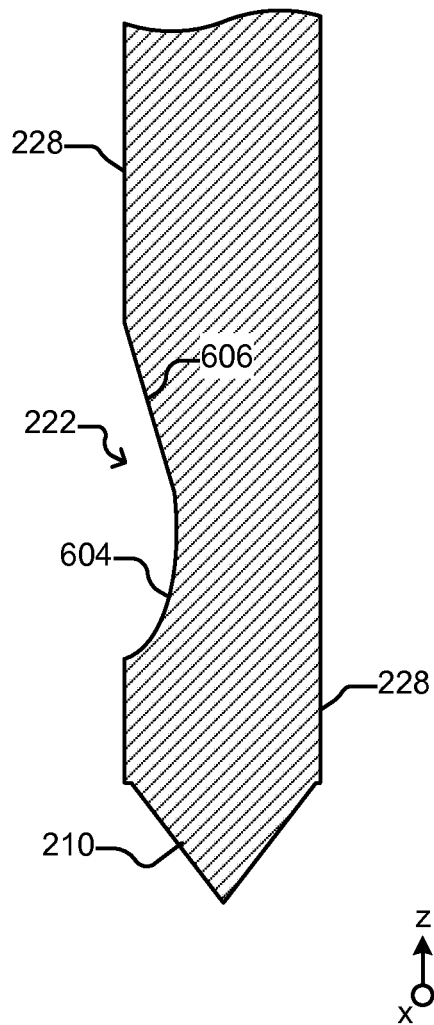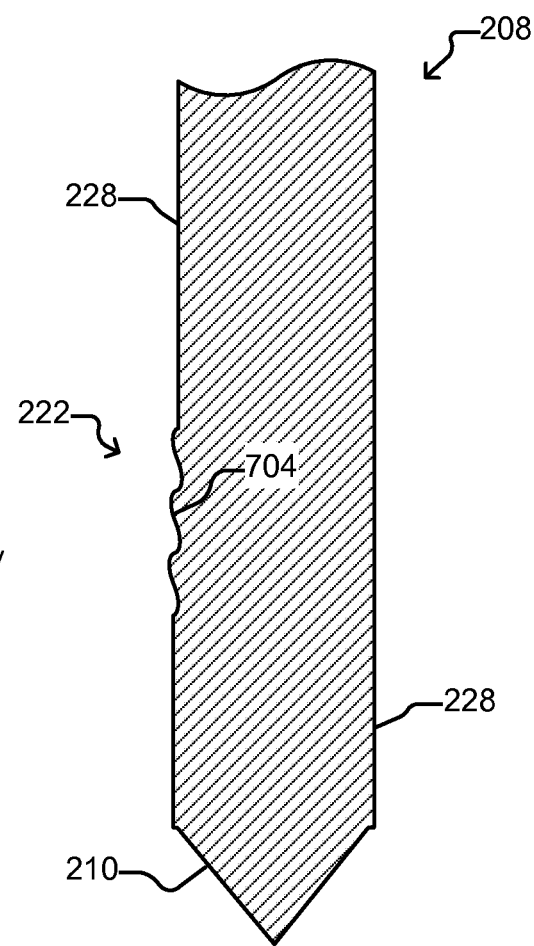

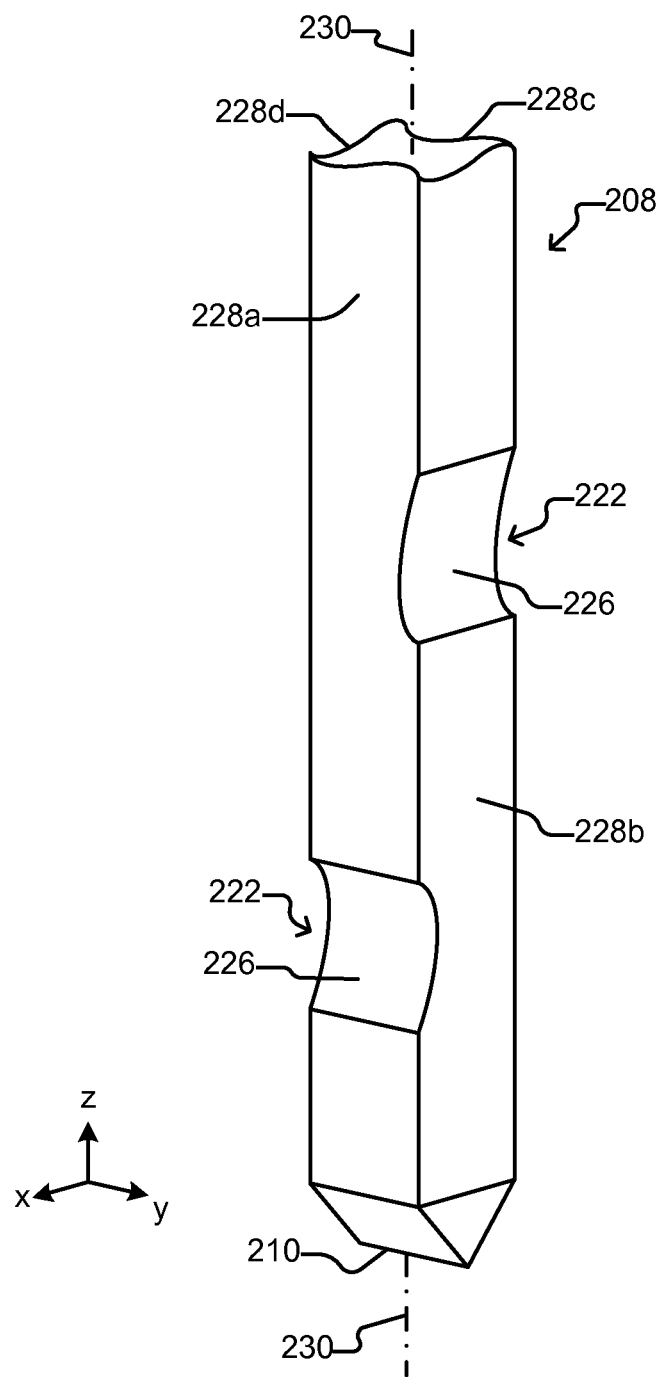

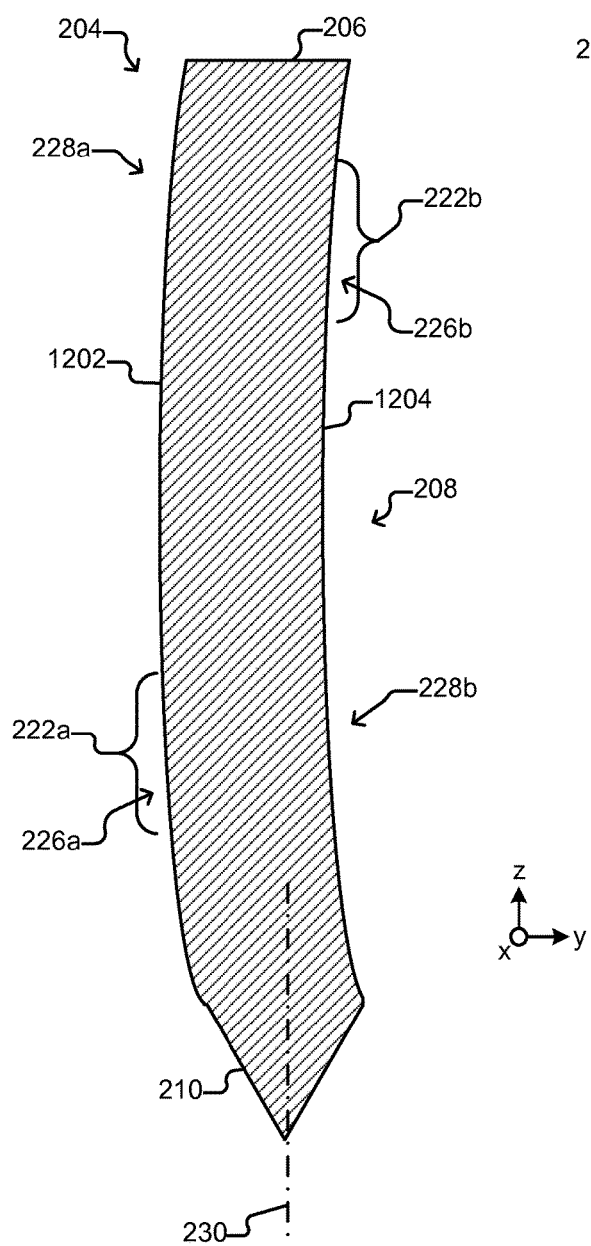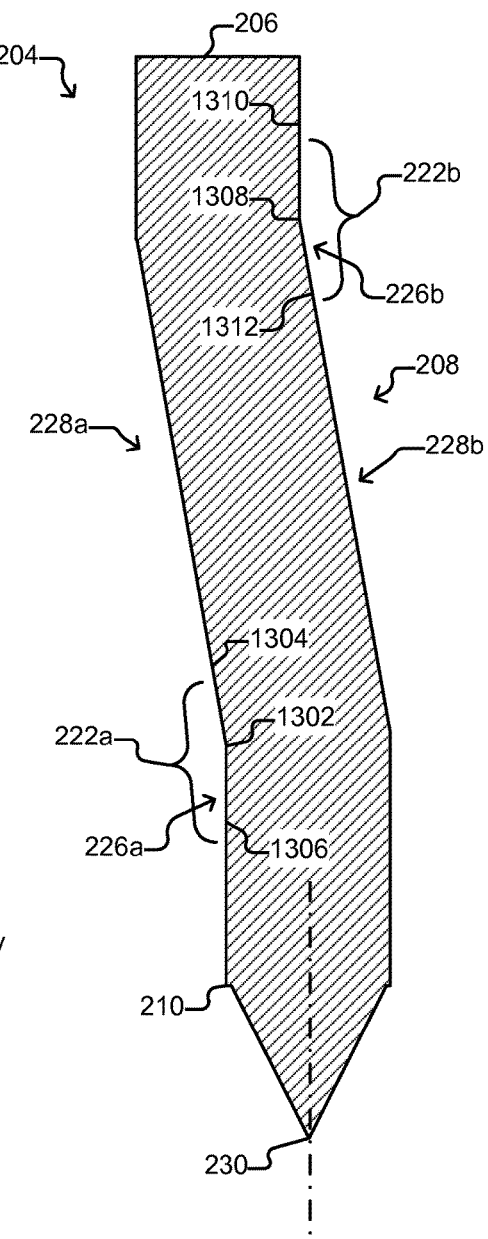

PROBES WITH PROGRAMMABLE MOTION

CROSS REFERENCE TO RELATED APPLICATION(S)

This application is a non-provisional (and thus claims the benefit of the filing date) of U.S. provisional patent application Ser. No. 61/583,154 (filed Jan. 4, 2012), which is incorporated herein in its entirety by reference.

BACKGROUND

An electrical connection can be made between electronic devices by pressing a terminal of one device against a probe connected to the other device. Effecting a wiping (also known as a scrubbing) motion of the probe on the terminal can cause the probe to break through oxide or other non-electrically conductive material on the terminal. This can aid in forming a relatively low-resistance electrical connection between the probe and the terminal.

FIG. 1A illustrates a cross-sectional, side view of an electrical device 102 with a probe 104 that extends through a hole 106 in a guide plate 108. As shown in FIGS. 1B and 1C, an electrical connection with another electronic device 110 can be effected by pressing a terminal 112 of the other electrical device 110 against the probe 104. FIG. 1B illustrates first contact of the terminal 112 with the probe 104. As the other electronic device 110 moves past the first contact shown in FIG. 1B toward the electronic device 102, the probe 104 flexes (e.g., compresses or buckles) or otherwise moves. The contact end of the probe 104 wipes in a motion S across the terminal 112 until the probe 104 contacts inner sidewalls of the guide hole 106 as shown in FIG. 1C. Thereafter, the sidewalls of the guide hole 106 control further lateral movement of the contact end of the probe 104 as the other electronic device 110 continues to move toward the electronic device 102.

As will be seen, embodiments of the present invention include probes with a patterned region that rides on a contact region of the sidewalls of a guide hole, which causes the contact tip of the probe to move in a pattern that relates to the patterned region. The patterned region can comprise one or more surfaces that extend into or out of a side of the probe. The wiping motion of the contact tip on the terminal can thus be pre-selected by the pattern of the surfaces of the patterned region.

SUMMARY

In some embodiments, an electronic contactor apparatus can include a guide and an electrically conductive probe. The guide can include a guide hole, and the probe can have a tip at an end of an elongated body, which can be disposed in the guide hole. The elongated body can include a first patterned region that contacts and rides on a first contact region of a first inner sidewall of the guide hole as the elongated body moves in the guide hole in response to a force on the tip. As the first patterned region rides on the first contact region, the tip can move in a pattern that comprises a lateral pattern that is a function of the surface(s) of the first patterned region.

In some embodiments, a probe card assembly can include a wiring substrate, a guide, and electrically conductive probes. The wiring substrate can include an electrical interface to a tester for controlling testing of an electronic device under test (DUT), and the guide can have guide holes. The electrically conductive probes can be disposed to contact terminals of the DUT and electrically connected to the electrical interface. Each probe can include a tip at an end of an elongated body, which can be disposed in a corresponding one of the guide holes. The elongated body can have a first patterned region that contacts and rides on a first contact region of a first inner sidewall of the corresponding guide hole as the elongated body moves in the corresponding guide hole in response to a force of one of the terminals of the DUT against the tip. As the first patterned region rides on the first contact region, the tip can move on the terminal in a pattern that comprises a lateral pattern that is a function of the surface(s) of the first patterned region.

BRIEF DESCRIPTION OF THE DRAWINGS

FIGS. 3A-3C show movement patterns of the contact tip of the probe as a terminal of an electronic device is pressed against the contact tip according to some embodiments of the invention.

FIGS. 4-7 illustrate examples of surfaces that can constitute a patterned region on the elongated body of a probe according to some embodiments of the invention.

FIG. 9 illustrates a partial perspective view of a probe with patterned regions according to some embodiments of the invention.

FIGS. 12-14 illustrate examples in which the patterned region of probe is a region of the otherwise regular features of a side of the probe according to some embodiments of the invention

DETAILED DESCRIPTION OF EXEMPLARY EMBODIMENTS

Figure 1A:
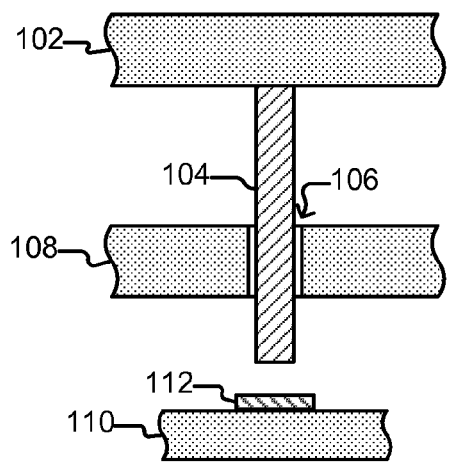
FIGS. 1A-1C illustrates wiping of a prior art probe as a terminal of an electronic device is pressed against the probe.
Figure 1B:
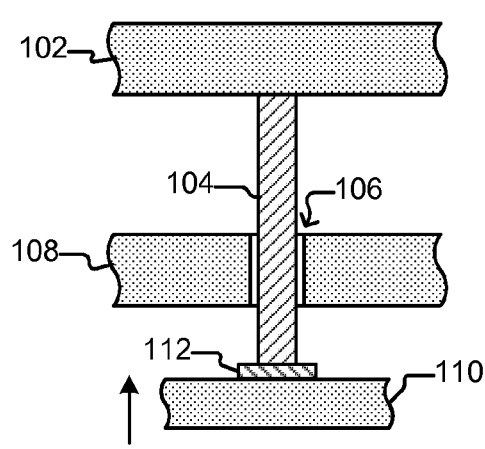
Figure 1C:
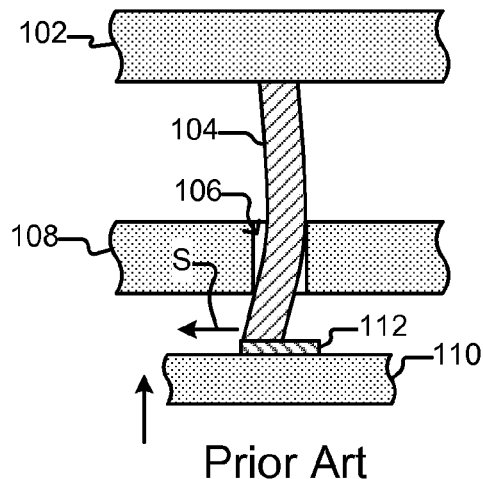

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, the following words have the following meanings: "buckle" means to bend, warp, distort, or crumple; and "compress" means pressed together into less volume or space, or to make more compact by or as if by pressing. The term "flex" is a broad term meaning movement in response to a force; "flex" thus encompasses movement due to buckling or compressing. The term "translate" means movement in a particular direction; and "elongated" means long and slender, or when used to describe an object or structure, means that the object or structure has a length that is longer than any width of the object or structure.

As used herein, a "patterned region" is not a merely flat surface but comprises at least one of a curved surface or two surfaces with a discontinuity between the two surfaces.

As used herein, "lateral" means of, relating to, or situated at or on the side; and lateral movement, motion, wipe, or scrub of a probe contact tip means movement, motion, wipe, or scrub to the side of the probe. Thus, for example, lateral movement, motion, wipe, or scrub of the contact tip of a probe initially aligned generally on a vertical axis includes movement, motion, wipe, or scrub of the contact tip to the side of the vertical axis.

As used herein, the terms "wipe" and "scrub" are synonymous.

As used herein, "compliant" means able to move or give in response to a force. The term compliant covers plastic deformation and/or elastic deformation. Plastic deformation refers to deformation—i.e., a change in shape or position—of an object in response to a force from which the object does not completely recover after removal of the force. A structure that elastically deforms in response to a force recovers substantially its original shape or position after removal of the force. An object that elastically deforms is referred to herein as being elastic or an elastic object. As used herein, the term "resilient" is synonymous with elastic.

Figure 2A:
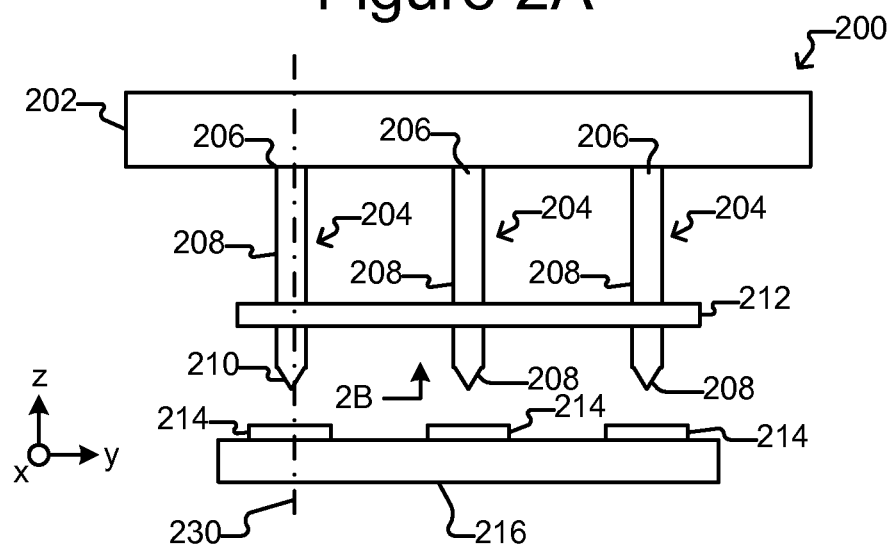
FIG. 2A illustrates a side view and FIG. 2B a bottom view of an electronic contactor apparatus according to some embodiments of the invention.
Figure 2B:
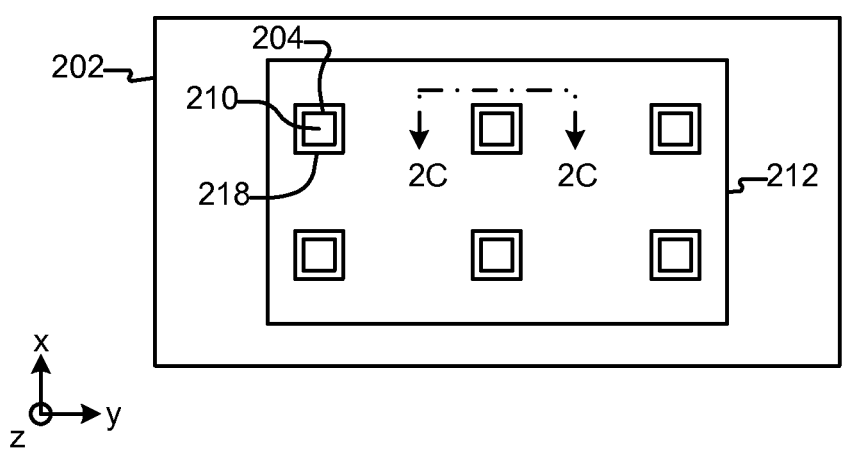
FIG. 2C illustrates a partial, cross-sectional side view of part of one of the probes of the apparatus of FIGS. 2A and 2B according to some embodiments of the invention.

FIGS. 2A-2C illustrate an example of an electronic contactor apparatus 200 that embodies aspects of the invention. As shown in FIGS. 2A and 2B, the contactor apparatus 200 can include a substrate 202. Electrically conductive probes 204 (three are shown but there can be fewer or more) can extend from the substrate 202. Each probe 204 can comprise a base 206, a contact tip 210, and an elongated body 208 between the base 206 and the tip 210. The elongated body 208 of each probe 204 can extend through a guide hole 218 in a guide 212. Although the elongated body 208 of each probe is shown in FIG. 2B as having a square shaped cross section taken through an axis 230 along the length of the elongated body 208, the cross section can be other shapes such as a rectangle, triangle, other polygons (e.g., a hexagon), a circle, an oval, or the like. Also, the elongated body 208 can have multiple cross-sections along the length of the elongated body 208. For example, the elongated body 208 can have a circular cross section along part of the length of the elongated body 208 and a rectangular or oval cross section along another part of the length of the elongated body 208. Such changes in cross-section can be tailored to affect the motion of the probes 204 as described herein.

A second tip, similar to contact tip 210, can replace the base 206. Each probe 204 can thus comprise a second tip in place of the base 206 at the opposite end of the elongated body 208 from the contact tip 210.

The substrate 202 can be a wiring substrate. For example, substrate 202 can comprise electrically conductive terminals (not shown) to which bases 206 of the probes 204 can be attached or otherwise electrically connected. The substrate 202 can also comprise internal and/or external electrically conductive wiring (e.g., electrically conductive traces and/or vias on and/or in the substrate 202) (not shown). The wiring (not shown) can electrically connect the probes 204 to terminals (not shown) and/or electrical components (not shown) on and/or in the substrate 202. In some embodiments, the substrate 202 can be a printed circuit board, a ceramic substrate comprising wiring (not shown), or the like.

The probes 204 can be spring-contact probes. As shown, each probe 204 can comprise a base 206, a contact tip 210, and an elongated body 208 between the base 206 and the contact tip 210. The elongated body 210 can be compliant and in some embodiments resilient (i.e., elastic). As mentioned, the bases 206 can be attached to the substrate 202. Each contact tip 210 can be configured and disposed in a pattern to contact and thereby make an electrical connection with a terminal 214 of an electronic device 216.

The guide 212 can include guide holes 218 (see FIGS. 2B and 2C) through which an elongated body 208 of one of the probes 204 passes. For example, the guide 212 can be a plate, substrate, or the like. The guide 212 can be coupled to the substrate 202 or otherwise held in place with respect to the substrate 202.

Figure 3B:
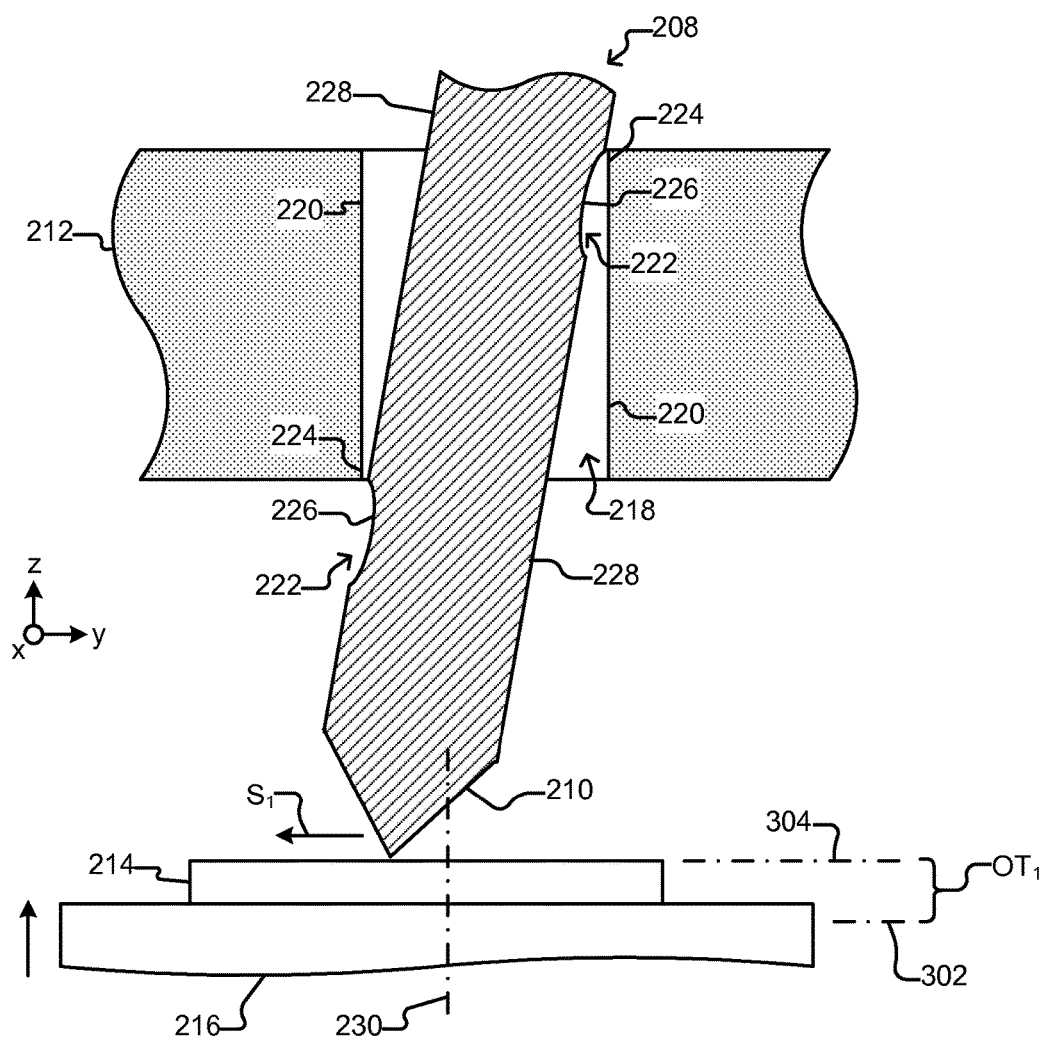

As shown in FIG. 2C, the elongated body 208 of each probe 204 can include one or more patterned regions 222 (two are shown but there can be fewer or more) positioned along the elongated body 208 so that each patterned region 222 contacts and rides on a corresponding contact region 224 that is part of an inner sidewall 220 of the guide hole 218 as a force (e.g., from contact with a terminal 214) on the contact tip 210 moves the probe 204 in the guide hole 218. The riding of a patterned region 222 along a contact region 224 can cause the contact tip 210 to move in a movement pattern, which can be a function (as used herein, a "function" can be linear or non-linear, continuous or non-continuous) of the patterned region 222. An example is illustrated in FIGS. 3A-3C, which are discussed below.

As shown in FIG. 2C, the elongated body 208 can be initially positioned in the guide hole 218 such that each patterned region 222 is a distance D from one of the contact regions 224. In some embodiments, however, there may be no initial distance D between a patterned region 222 and a corresponding contact region 224. Regardless, as also shown in FIG. 2C, there can be a gap G between the elongated body 208 and one or more of the inner sidewalls 220 of the guide hole 218. In some embodiments, there can be a gap G between the elongated body 208 and less than all of the inner sidewalls 220 and/or only part of one or more of the inner sidewalls 220. In some embodiments, there may not be a gap G between the elongated body 208 and any of the inner sidewalls 220. Regardless, as shown, in some embodiments, the contact regions 224 can be adjacent the openings of the guide hole 218 in opposite surfaces of the guide 212.

Each patterned region 222 can comprise one or more surfaces 226 that extend out of and/or into a side 228 of the elongated body 208 of a probe 204. That is, a side 228 of the elongated body 208 can have a particular geometry. For example, a side 228 of the elongated body 208 can itself comprise a surface of a particular geometry. If, for example, the elongated body 208 has polygon (e.g., square or rectangular) shaped cross section, the sides 228 can have the geometry of a flat surface. In such a case, the one more surfaces 226 of a patterned region 222 can extend into and/or out of the flat surface of the side 228 and thus be geometrically distinct from the flat surface of the side 228. Alternatively, if the elongated body 208 has a circular or oval shaped cross section, a side 228 can comprise a portion of the curved outer surface of the elongated body 208 that wraps around the axis 230. In such a case, the one or more surfaces 226 of a patterned region 222 can extend into and/or out of the curved surface of side 228 and thus be geometrically distinct from the curved surface of the side 228. Each patterned region 222 thus can comprise one or more surfaces 226 that form a distinct geometric feature or features that extend into and/or out of a side 228 of the elongated body 208 of the probe 204 and are geometrically different than and distinct from the geometry of the side 228 and general outer contour of the elongated body 208. Put another way, the one or more surfaces 226 of a patterned region 222 can be a discontinuity or discontinuities in the geometric shape of a side 228 of the elongated body 208 of a probe 204.

Each surface 226 of a patterned region 222 can be flat, curved, or the like. For example, each surface 226 can comprise splines, curves, polylines, a series of curves, a series of lines, a series of curves and lines, or the like. Moreover, although the example shown in FIG. 2C illustrates each patterned region 222 as extending into the elongated body 208, a patterned region 222 can alternatively extend out of the elongated body 208 or extend into and out of the elongated body 208. Examples of patterned regions 222 are illustrated in FIGS. 4-7, which are discussed below.

As shown in FIG. 2A, the probes 204 can, in some embodiments, be vertical probes. The base 206, elongated body 208, and contact tip 210 of a probe 204 can thus be aligned generally along a vertical axis 230 as shown in FIG. 2A. As shown, the length of the elongated body 208 can be oriented generally along the vertical axis 230. In other embodiments, however, the probes 204 need not be vertical probes. The orientation of the probe 204 in FIG. 2A is thus an example only and is not limiting.

FIGS. 3A-3C illustrate an example in which a terminal 214 of the electronic device 216 (see FIG. 2A) is pressed against the contact tip 210 of a probe 204. The resulting force on the contact tip 210 can move the probe 204 in the guide hole 218, causing the patterned regions 222 to contact and ride on corresponding contact regions 224, further causing the contact tip 210 to move in a movement pattern $S_2$ on the terminal 214. Although the examples discussed herein describe the terminal 214 as being moved into contact with a probe 204, the contactor apparatus 200 (and thus the probes 204) can alternatively or in addition be moved into contact with (e.g., pressed against) the terminals 214.

FIG. 3A illustrates the probe 204 in a guide hole 218 as shown in FIG. 2C and a terminal 214 of the electronic device 216 shown in FIG. 2A. Reference 302 represents a location of the terminal 214 at first contact of the terminal 214 with the contact tip 210. (Hereinafter reference 302 is referred to as "first contact.") As noted above, initially, in some embodiments, there can be a gap G between the elongated body 208, which can initially be positioned in the guide hole 218 with a distance D between a patterned region 222, and a corresponding contact region 224. As also noted, in some embodiments, there can be no such gap G or distance D.

FIG. 3B shows the probe 204 and terminal 214 of FIG. 3A with the terminal 214 in a position 304 as the terminal 214 is moving toward the contactor apparatus 200 (see FIG. 2A) generally along the "z" axis, which as discussed above, can in some embodiments, correspond to a vertical axis 230. At position 304, the terminal 214 has been moved an initial (e.g., first) over travel $OT_1$ distance past first contact 302 with the contact tip 210.

As also shown in FIG. 3B, while moving the over travel $OT_1$ distance, the elongated body 208 can also move generally in an "x, y" plane (which can be generally horizontal with respect to the vertical axis 230), resulting in a first wiping motion $S_1$ on the terminal 214. The elongated body 208 also moves generally along the "z" axis such that a first end of each patterned region 222 generally aligns with a corresponding contact region 224. The distance D and gap G (see FIGS. 2C and 3A) can be selected with respect to the over travel $OT_1$ distance to achieve the foregoing. The elongated body 208 can flex (e.g., compress or buckle) and/or otherwise move in the guide hole 218 as the terminal 214 moves the over travel distance $OT_1$. As noted above, the probe 204 can be a vertical probe, and the above discussed force on the contact tip can be generally vertical.

FIG. 3C illustrates the probe 204 and terminal 214 of FIG. 3A as the terminal is moving a further (e.g., second) over travel $OT_2$ distance toward the contactor apparatus 200 (see FIG. 2A) generally along the "z" axis. As the terminal 214 is moving the over travel $OT_2$ distance, the patterned regions 222 can contact and ride on the contact regions 224, causing the contact tip 210 to move in a second movement pattern $S_2$ on the terminals 214. As noted above, in some embodiments, the probe 204 can be a vertical probe, and as shown in FIG. 3C, the movement $S_2$ can be lateral movement (i.e., movement to the side of the initial axis 230 of the probe 204). Regardless, the size of each patterned region 222 can correspond to at least the over travel $OT_2$ distance so that each patterned region 222 rides on a corresponding contact region 224 during the over travel $OT_2$.

The second movement pattern $S_2$ can be a function of or otherwise relate or correspond to each of the shapes of the surfaces 226 of the patterned regions 222. For example, if there is only one patterned region 222 on the elongated body 208 of a probe 204, the second movement pattern $S_2$ of the contact tip 210 of the probes 204 can be a function of the shapes of the surfaces 226 of the patterned region 222. As another example, if there are multiple patterned regions 222 on the elongated body 208 of a probe 204, the second movement pattern $S_2$ of the contact tip 210 of the probes 204 can be a function of a combination of those patterned regions 222. The second movement pattern $S_2$ can thus be a result of one patterned region 222 riding on a corresponding contact region 224 or the combined effect of more than one patterned region 222 riding on corresponding contact regions 224. The second movement pattern $S_2$ of the contact tip 210 of a probe 204 can thus be programmed by such parameters as the number and location of patterned regions 222 and the configuration of the surfaces 226 of each patterned region 222. Where there are multiple patterned regions 222 on a probe 204, the patterned regions 222 can be the same or different and can be configured to reinforce and/or cancel each other. In fact, multiple patterned regions 222 on a probe 204 can be configured such that the second movement pattern $S_2$ consists of no appreciable lateral movement of the contact tip 210.

In the example illustrated in FIGS. 3A-3C, the patterned region 222 comprises a curved surface 226 that rides on a corresponding contact region 224 during over travel $OT_2$. The illustrated curved surface 226 can cause the movement $S_2$ of the contact tip 210 on the terminal 214 to be first one direction and then the substantially opposite direction. As discussed above, however, this is merely an example, and patterned region 222 can comprise one or more surfaces 226 of a variety of different shapes configured to impart a variety of different motions to the movement $S_2$. FIGS. 4-7 illustrate other examples.

Figure 4:
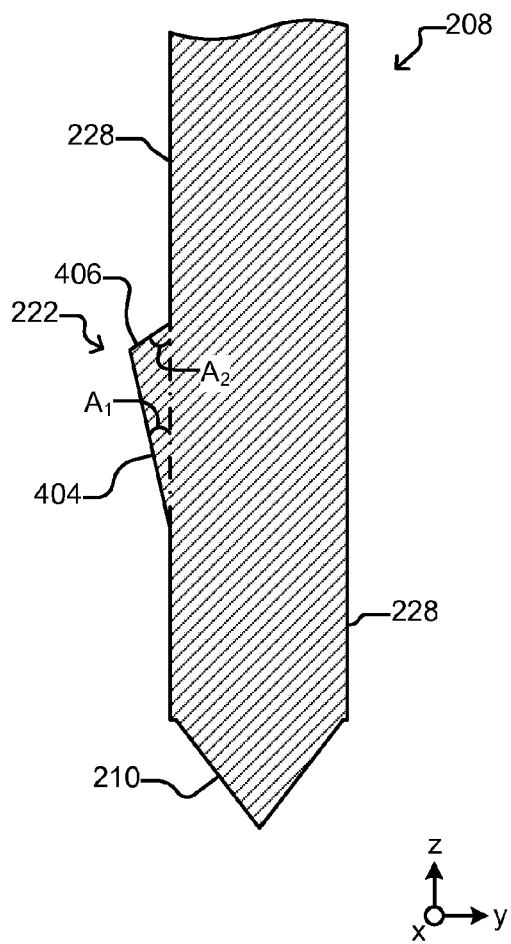

As illustrated in FIG. 4, the patterned region 222 can comprise surfaces 404 and 406 that extend from, rather than into, a side 228 of the elongated body 208 of a probe 204. Moreover, the surfaces 404 and 406 can be straight rather than curved. In the example shown in FIG. 4, the angle $A_1$ by which surface 404 diverges from a side 228 of the elongated body 208 is greater than the angle $A_2$ by which the surface 406 diverges from the side 228, and the length of the surface 404 is greater than the length of the surface 406. The result can be that the movement $S_2$ (see FIG. 3C) of the contact tip 210 is gradually in one direction as surface 404 rides a corresponding contact region 224 during over travel $OT_2$ and then more abrut in an opposite direction as surface 406 rides the corresponding contact region 224. The configuration of the patterned feature 222 illustrated in FIG. 4, however, can be changed to produce a different movement pattern $S_2$. For example, the angle $A_1$ can be greater than the angle $A_2$, and the length of the surface 404 can be shorter than the length of the surface 406. As another example, the angles $A_1$ and $A_2$ can be approximately equal, and the lengths of the surfaces 404 and 406 can be approximately equal.

Figure 5:
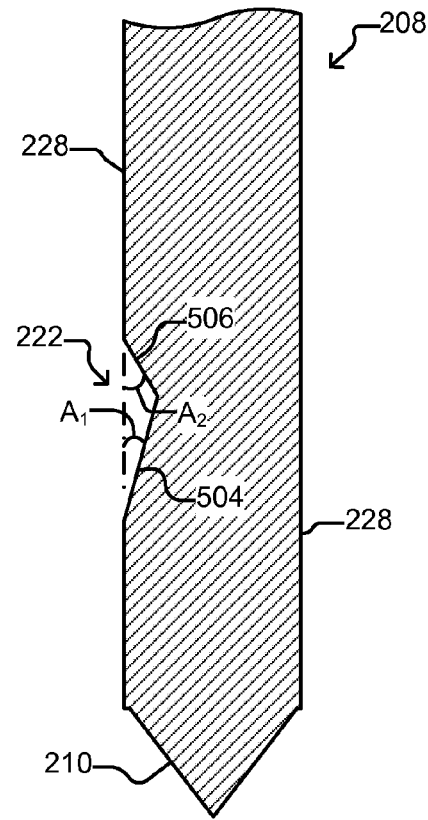

FIG. 5 illustrates an example of a patterned region 222 in which straight surfaces 504 and 506 extend into the side 228 of the elongated body 208 of a probe 204. As illustrated, surface 504 can diverge at an angle $A_1$ from a side 228 of the elongated body 208, and surface 506 can diverge at an angle $A_2$ from a side 228 of the elongated body 208.

FIG. 6 illustrates an example in which a patterned region 222 comprises a curved surface 604 and a straight surface 606 that ride on a corresponding contact region 224 during over travel $OT_2$. Alternatively, surface 606 can be a curved surface, and surfaces 604 and 606 can thus be contiguous or linked curved surfaces. FIG. 7 illustrates an example in which a patterned region 222 comprises a sequence of surfaces that diverge differently from a side 228 of the elongated body 208. For example, the sequence of differently diverging surfaces can form an undulating or wave pattern 702, as shown in FIG. 7, that rides on a corresponding contact region 224 during over travel $OT_2$. The corresponding movement $S_2$ of the contact tip 210 can be a repeating back and forth motion.

Figure 8A:
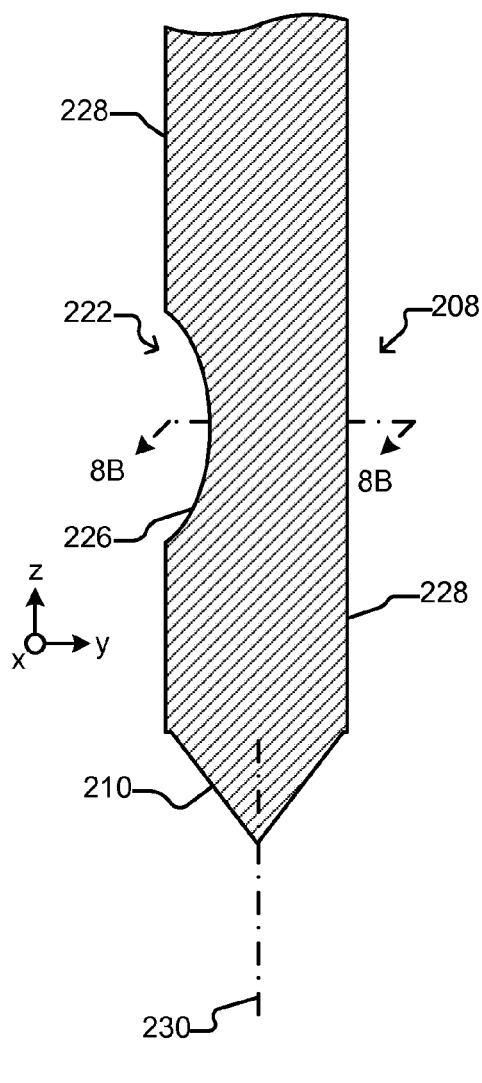
FIG. 8A illustrates a partial side view of a probe with a patterned region.
Figure 8B:
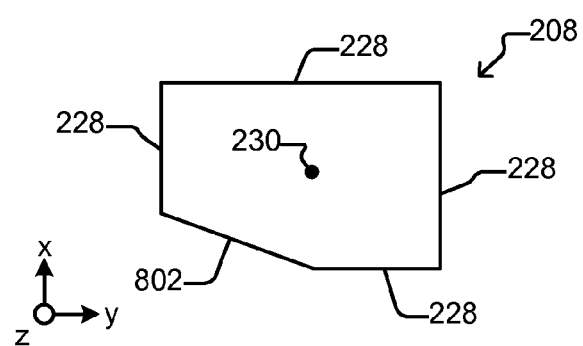
FIG. 8B illustrates a top, cross-sectional view of the probe illustrating an example of a contour for imparting rotation to the probe according to some embodiments of the invention.

Although the examples discussed above produce a generally lateral movement, scrubbing, or wiping pattern, probes 204 can also be configured to include other types of movements in the pattern $S_2$. An example is illustrated in FIGS. 8A and 8B. FIG. 8A shows a partial view of the elongated body 208 and tip 210 of a probe 204 with a patterned region 222 as discussed above. FIG. 8B is a top, cross-sectional view of the elongated body 208 taken through the patterned region 222. As shown, the patterned region 222 can further include a contour 802 that can cause the contact tip 210 to rotate (e.g., generally about the axis 230) and thus impart a rotational component to the movement pattern $S_2$ as the patterned region 222 rides on a corresponding contact region 224 during over travel $OT_2$.

Other examples of ways to impart rotation to the movements in the pattern $S_2$ include techniques illustrated in FIGS. 26C, 26D, 27, 30, 31A, and 31B of U.S. patent application Ser. No. 13/288,925, filed Nov. 3, 2011. The foregoing U.S. patent application Ser. No. 13/288,925 is incorporated herein by reference.

FIG. 9 illustrates yet another variation. As shown in FIG. 9, where the elongated body 208 of a probe 204 has a cross-section of a polygon (e.g., a square or rectangle as illustrated in FIG. 9), a patterned region 222 can be on any one or more of the sides 228 of the elongated body 208. In the example shown in FIG. 9, there are patterned regions 222 on sides 228a and 228b of the elongated body 208 that are not co-planar (e.g., not parallel). There could alternatively or additionally be patterned regions 222 on sides 228c and 228d. Where the patterned regions 222 are on sides 228a and 228b that are not co-planar (e.g., not parallel), as shown in the example of FIG. 9, the resulting second movement pattern $S_2$ (see FIG. 3C), can be in multiple directions in the "x, y" plane (e.g., a plane that is generally perpendicular to the vertical axis 230). For example, the second movement pattern $S_2$ can comprise spiral, circular, or the like movement components.

Figure 10A:
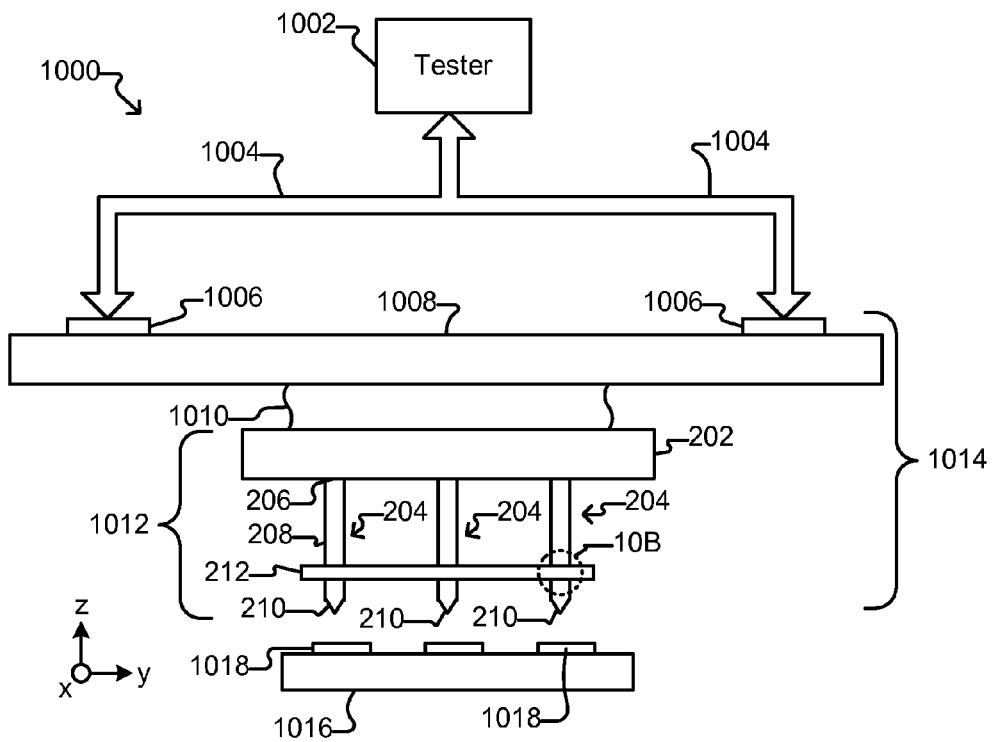
FIG. 10A illustrates a test system, including a probe card assembly with a probe head assembly that includes the electronic device of FIGS. 2A and 2B, for testing a DUT according to some embodiments of the invention.
Figure 10B:
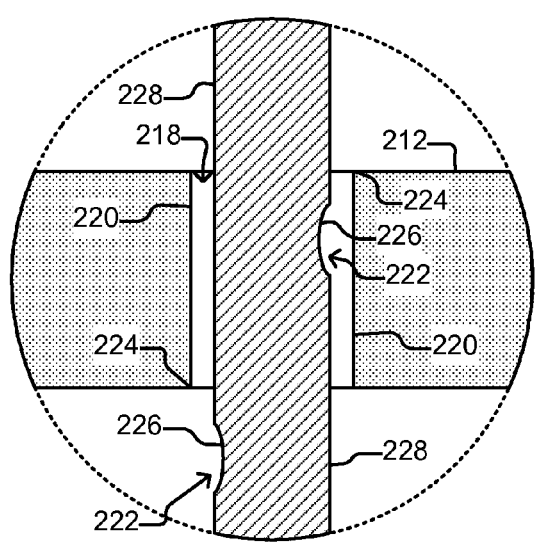
FIG. 10B shows a partial side, cross-sectional view of one of the probes of the probe card assembly of FIG. 10A according to some embodiments of the invention.

There are many possible uses and applications for probes 204 with a patterned region 222 that rides on a corresponding contact region 224 of a guide hole 218. FIGS. 10A, 10B, and 10 illustrate examples.

FIG. 10A illustrates a test system 1000 that includes a probe card assembly 1014 for testing a DUT 1016. DUT 1016 (which can be an acronym for device under test) can be any electronic device or devices to be tested, including without limitation one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronic devices, one or more printed circuit boards, or any other type of electronic device or devices.

The tester 1002 can be configured to control testing of DUT 1016. The tester 1002 can be, for example, a computer or other controller programmed to control such testing. Communications channels 1004 (e.g., cables, wires, fiber optics, wireless communications means, or the like) can provide individual signal and power delivery paths between the tester 1002 and the probe card assembly 1014. As discussed below, the probe card assembly 1014 can provide additional signal and power delivery paths to terminals 1018 of DUT 1016.

As shown in FIG. 10A, the probe card assembly 1014 can comprise a wiring substrate 1008, an interconnector 1010, and a probe head assembly 1012. The wiring substrate 1008, interconnector 1010, and probe head assembly 1012 can be held together by brackets, screws, bolts and/or other suitable means (not shown).

The wiring substrate 1008 can include electrical connectors 1006 (e.g., an electrical interface to a tester 1002) configured to make electrical connections with the communications channels 1004. Connectors 1006 can be pads for receiving pogo pins, zero-insertion-force connectors, or any other electrical connection device suitable for making electrical connections with communications channels 1004. The wiring substrate 1008 can further include electrically conductive paths (not shown) from the connectors 1006. Those conductive paths (not shown) can comprise, for example, electrically conductive traces and/or vias on and/or in the wiring substrate 1008. The wiring substrate 1008 can be a printed circuit board, ceramic substrate, or the like.

As shown, the probe head assembly 1012 can comprise the contactor apparatus 200 of FIGS. 2A and 2B. That is, the probe head assembly 1012 can comprise substrate 202 (which can be a probe substrate), probes 204, and guide 212 including any variation as described above. Thus, as shown in FIG. 10B, the elongated body 208 of each probe 204 can be disposed in one of the guide holes 218 in the guide 212, and the elongated body 208 can comprise one or more patterned regions 222 configured to contact and ride on a corresponding contact region 224 of an inner wall 220 of a guide hole 218. The substrate 202 can comprise electrically conductive paths (not shown) to the probes 204. Those conductive paths (not shown) can comprise, for example, electrically conductive traces and/or vias on and/or in the substrate 202.

The interconnector 1010 (which can comprise an interposer, wires, or the like) can electrically connect the electrical paths (not shown) of the wiring substrate 1008 to the electrical paths (not shown) of the substrate 202. The probe card assembly 1014 can thus connect the signal and power paths of the communications channels 1004 to the terminals 1018 of DUT 1016. The tester 1002 can then control testing of DUT 1016 by, for example, providing signals and power through the communications channels 1004 and probe card assembly 1014 to DUT 1016, and the tester 1002 can receive signals from DUT 1016 through the probe card assembly 1014 and the communications channels 1004.

The configuration of the probe card assembly 1014 illustrated in FIG. 10A is an example only, and variations are possible. For example, multiple probe head assemblies 1012 can be connected to the wiring substrate 1008. As another example, substrate 202 can be electrically connected directly to the wiring substrate 1008, and interconnector 1010 thus need not be included. Of course, the probe card assembly 1014 can include other elements such as mechanical stiffeners (not shown) or the like.

DUT 1016 can be tested as follows. Terminals 1018 of DUT 1016 can be pressed against the contact tips 210 of the probes 210 generally shown in FIGS. 3A-3C, which can cause each contact tip 210 to scrub a corresponding terminal 1018 as also generally shown in FIGS. 3A-3C. With probes 210 in contact with terminals 1018, the tester 1002 can generate test signals, which can be provided through the communications channels 1004 and probe card assembly 1014 to DUT 1016. Response signals generated by DUT 1016 can be provided from DUT 1016 through the probe card assembly 1014 and communications channels 1004 to the tester 1002. The tester 1002 can analyze the response signals to determine whether DUT 1016 (or any part of DUT 1016) responded properly to the test signals and, consequently, whether DUT 1016 passes or fails the testing. The tester 1002 can alternatively or in addition rate the performance of DUT 1016. As noted above, DUT 1016 can comprise individual electronic devices (e.g., semiconductor dies), and tester 1002 can determine whether individual ones of the devices that constitute DUT 1016 passed or failed the testing and/or rate individual ones of those devices.

Figure 11:
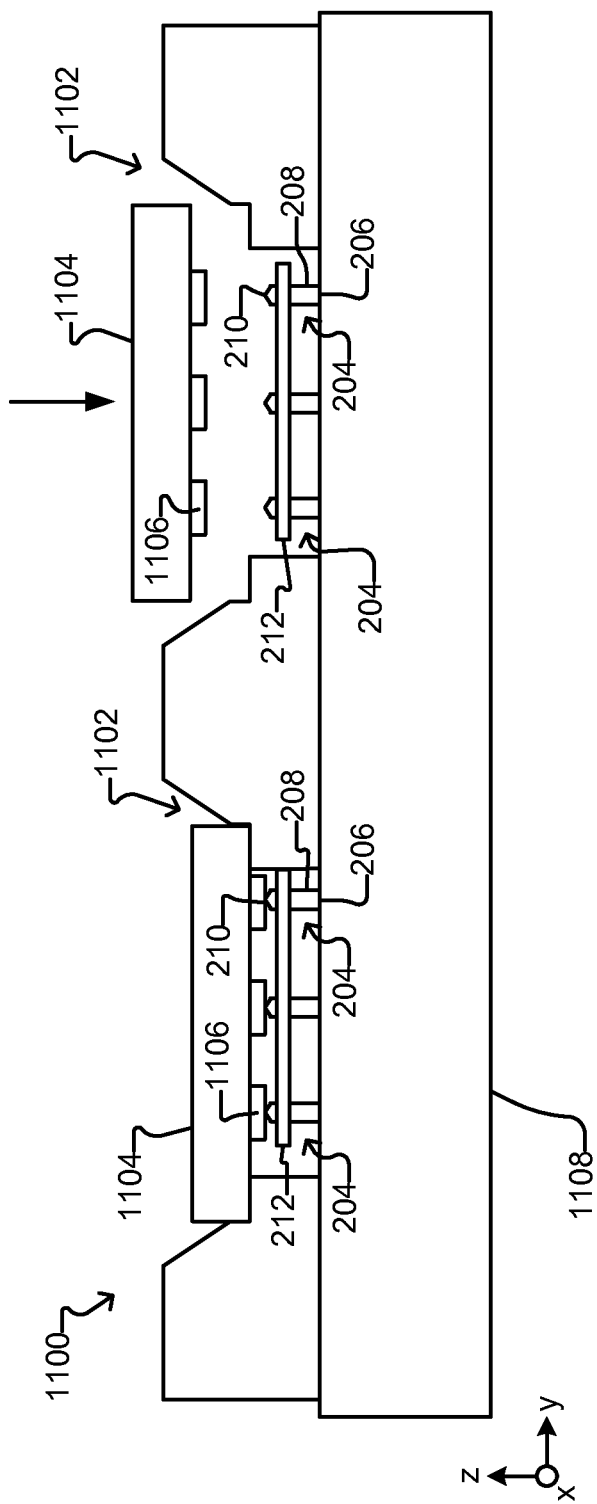
FIG. 11 illustrates a socket that can include the probes of FIGS. 2A-2C disposed in guide holes and having patterned regions for contacting and riding on contact regions of the inner sidewalls of the guide holes according to some embodiments of the invention.

FIG. 11 illustrates an electrical socket 1100 having a wiring substrate 1108 with device sites 1102 for electronic devices 1104. As shown, bases 206 of probes 204 can be connected to the wiring substrate 1108 (e.g., in the same manner as the bases 206 are connected to the substrate 202 in FIGS. 2A and 2B as discussed above), and elongated bodies 208 of the probes 204 can pass through guide holes 218 (not shown in FIG. 11) in guide 212 as discussed above. Moreover, although not shown, the elongated bodies 208 can have one or more patterned regions 222 that contact and ride on corresponding contact regions 224 of the inner sidewalls 220 of the guide holes 218, which can cause the contact tips 210 of the probes 204 to scrub a corresponding terminal 1106 as the terminals 1106 are pressed against the contact tips 210 of the probes 204 as generally shown in FIGS. 3A-3C and discussed above.

The wiring substrate 1108 can comprise electrical paths (not shown) such as electrically conductive traces (not shown) and/or vias (not shown) on and/or in the wiring substrate 1108. Those electrical paths (not shown) can electrically connect ones of the probes 204 to other probes 204, electrical terminals (not shown), electronic components (not shown), or the like on, in, or connected to the wiring substrate 1108.

Figure 14:
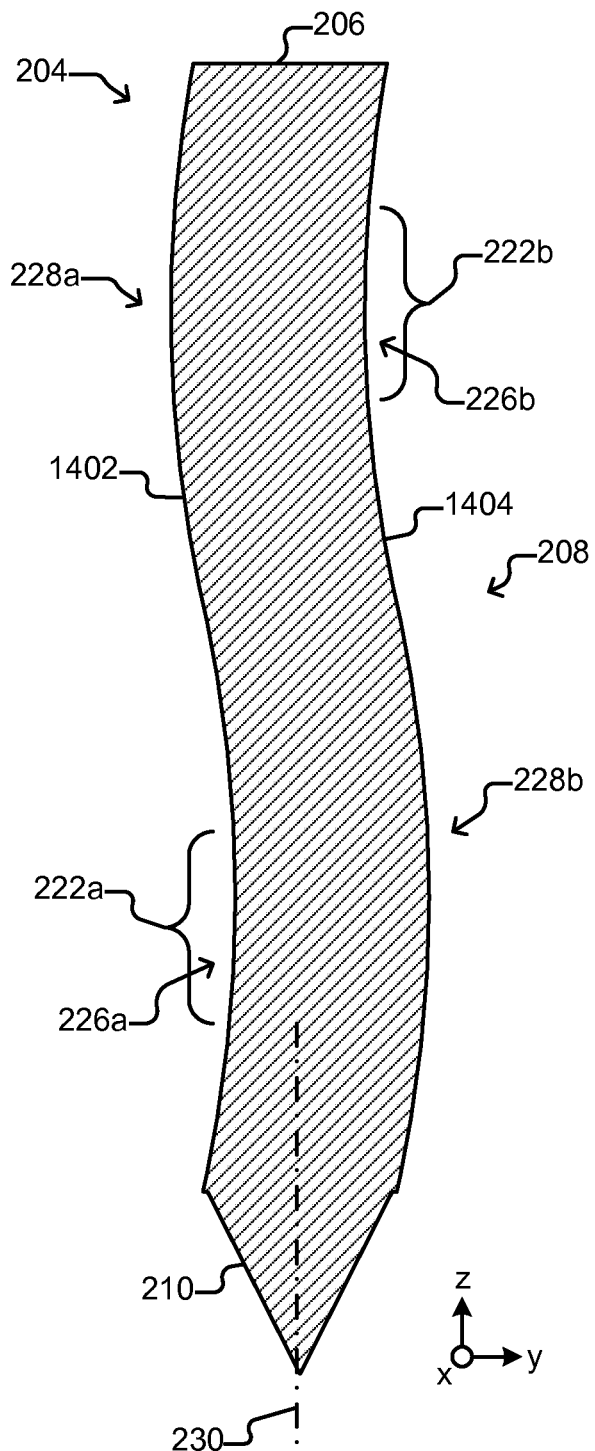

Although the one or more surfaces 226 of the patterned regions 222 of the probes 204 are illustrated in FIGS. 2C, 3A-3C, 4-8A, 9, and 10B and discussed above as distinct geometric features that extend into and/or out of a side 228 of the elongated body 208 of a probe 204, a patterned region 222 can alternatively or in addition comprise a portion of the regular surface features of a side 228 of the elongated body 208. FIGS. 12-14 illustrate examples.

As illustrated in FIG. 12, a first side 228a of the elongated body 208 of a probe 204 can have a continuous curved surface 1202 along the length of the body 208, and an opposite second side 228b of the elongated body 208 can also have a continuous curved surface 1204 also along the length of the body 208. For example, in some embodiments, the curved surface 1202 of the elongated body 208 can be continuous from the base 206 of the probe 204 to the contact tip 210, and the curved surface 1204 can similarly be continuous from the base 206 to the contact tip 210. In some embodiments, the radius of curvature of the curved surface 1202 and the radius of curvature of the curved surface 1204 can be substantially the same. In other embodiments, the curved surfaces 1202 and 1204 can have different radii of curvature. As another example, in some embodiments, the curved surfaces 1202 and 1204 can be substantially parallel to each other.

Regardless, the one or more surfaces 226 of the patterned regions 222 that engage and ride on corresponding contact regions 224 of the inner surfaces 220 of a guide hole 218 (as discussed above) can be regions of the continuous curved surfaces 1202 and 1204. Thus, the one or more surfaces 226a of a first patterned region 222a on the first side 228a of the elongated body 208 in the example shown in FIG. 12 can be a region of the curved surface 1202, and the one or more surfaces 226b of a second patterned region 222b on the second side 228b can be a region of the curved surface 1204. Generally as discussed above, with respect to FIGS. 3A-3C, as the patterned regions 222a and 222b engage and ride contact regions 224 during the over travel $OT_2$ distance, a movement pattern $S_2$ can be imparted to the contact tip 210 of the probe 204 that corresponds to the portions of the continuous curves 1202 and 1204 that correspond to the first and second patterned regions 222a and 222b. (See, in particular, FIG. 3C.)

FIG. 13 illustrates another example in which a patterned region 222 corresponds to a region of the regular features of the elongated body 208 of a probe 204. As shown, a first side 228a of the elongated body 208 of a probe 204 can comprise a plurality of contiguous but discontinuous surfaces. For example, as shown, the first side 228a can comprise, among other surfaces, a first continuous surface 1304 and a second continuous surface 1306, and there can be a discontinuity 1302 where the first surface 1304 meets the second surface 1306. The surfaces 1304 and 1306 can be any of a variety of shapes including flat, curved, or the like. As also shown, a first patterned region 222a of the elongated body 208 can comprise the discontinuity 1302 and portions of the first and second surfaces 1304 and 1306 immediately adjacent the discontinuity. As also shown, an opposite second side 228b of the elongated body 208 can also comprise a plurality of adjoining but discontinuous surfaces. For example, as shown, the second side 228b can comprise, among other surfaces, a first continuous surface 1310 and a second continuous surface 1312, and there can be a discontinuity 1308 where the first surface 1310 meets the second surface 1312. The surfaces 1310 and 1312 can be any of a variety of shapes including flat, curved, or the like. As also shown, a second patterned region 222b of the elongated body 208 can comprise the discontinuity 1308 and portions of the first and second surfaces 1310 and 1312 immediately adjacent the discontinuity 1308.

Thus, the one or more surfaces 226a of a first patterned region 222a on the first side 228a of the elongated body 208 in the example shown in FIG. 13 can be regions of the surfaces 1304 and 1306, and the one or more surfaces 226b of a second patterned region 222b on the second side 228b can be regions of the surfaces 1310 and 1312, for example, as illustrated in FIG. 13. The patterned regions 222 illustrated in FIG. 13 that can engage and ride on corresponding contact regions 224 of the inner surfaces 220 of a guide hole 218 (as discussed above) can thus be regions of contiguous but discontinuous surfaces 1304, 1306, 1310 and 1312. Generally as discussed above, with respect to FIGS. 3A-3C, as the patterned regions 222a and 222b of FIG. 13 engage and ride contact regions 224 during the over travel $OT_2$ distance, a movement pattern $S_2$ can be imparted to the contact tip 210 of the probe 204 that corresponds to the portions 1304 and 1306 and the discontinuity 1302 identified in FIG. 13 as corresponding to patterned region 222a and the portions 1310 and 1312 and the discontinuity 1308 identified in FIG. 13 as corresponding to patterned region 222b. (See, in particular, FIG. 3C.)

As illustrated in FIG. 14, a first side 228a of the elongated body 208 of a probe 204 can have a continuous, undulating curved surface 1402 along the length of the body 208, and an opposite second side 228b of the elongated body 208 can also have a continuous, undulating curved surface 1404 also along the length of the body 208. For example, in some embodiments, the undulating surface 1402 of the elongated body 208 can be continuous from the base 206 of the probe 204 to the contact tip 210, and the undulating surface 1404 can similarly be continuous from the base 206 to the contact tip 210. In some embodiments, the undulating surfaces 1402 and 1404 can be substantially parallel to each other. In other embodiments, however, the undulating surfaces 1402 and 1404 are not substantially parallel to each other.

Regardless, the patterned regions 222 that engage and ride on corresponding contact regions 224 of the inner surfaces 220 of a guide hole 218 (as discussed above) can be regions of the undulating curved surfaces 1402 and 1404. Thus, the one or more surfaces 226a of a first patterned region 222a on the first side 228a of the elongated body 208 in the example illustrated in FIG. 14 can be a region of the undulating surface 1402, and the one or more surfaces 226b of a second patterned region 222b on the second side 228b can be a region of the undulating surface 1404. Generally as discussed above, with respect to FIGS. 3A-3C, as the patterned regions 222a and 222b engage and ride contact regions 224 during the over travel $OT_2$ distance, a movement pattern $S_2$ can be imparted to the contact tip 210 of the probe 204 that corresponds to the portions of the undulating curves 1402 and 1404 that correspond to the first and second patterned regions 222a and 222b. (See, in particular, FIG. 3C.)

The embodiments illustrated in FIGS. 12-14 in which the patterned regions 222 correspond to regions of the regular features of sides 226 of the body 208 of a probe 204 are examples only and other curves, shapes, arrangements, and the like of the sides 226 can be used. Moreover, there can be more or fewer than two such regions 222a and 222b on a probe 204, and if there are more than two regions 222a and 222b, those regions need not be on opposite sides 228a and 222b of the probe 204. Regardless, the examples of the probes 204, including any such modification, can be used in the probe card assembly 1014 of FIG. 10 or the socket 1100 of FIG. 11.

Although specific embodiments and applications of the invention have been described in this specification, these embodiments and applications are exemplary only, and many variations are possible. For example, although the patterned regions 222 are shown on the elongated body 208 of a probe 204 and the contact regions 224 on an inner sidewall 220 of a guide hole 218 in the examples illustrated herein, a contact region 224 can be on the elongated body 208 of a probe 204 and a patterned region 222 can be on an inner sidewall 220 of a guide hole 218.

We claim:

1. An electronic contactor apparatus comprising:
a guide comprising a guide hole; and
a probe comprising a tip at an end of an elongated body disposed in said guide hole, said probe structured for said tip to contact and slide along a surface of a terminal of an electronic device under test (DUT) in response to a force of contact on said tip by said terminal;
wherein:
said elongated body comprises a first patterned region that contacts and rides on a first contact region in said guide hole and a second patterned region that contacts and rides on a second contact region in said guide hole as said elongated body moves in said guide hole in response to said force of contact on said tip, and
as said first patterned region rides on said first contact region and said second patterned region rides on said second contact region, said tip moves in a pattern that comprises lateral translation of said tip along said surface of said terminal, wherein said lateral translation is a combined function of said first patterned region and said second patterned region;
wherein the first patterned region comprises at least one of a curved surface or two surfaces with a discontinuity between the two surfaces;
wherein the second patterned region comprises at least one of a curved surface or two surfaces with a discontinuity between the two surfaces;
wherein:
said first patterned region comprises one or more surfaces that extend into or out of a side of said elongated body,
said second patterned region comprises one or more surfaces that extend into or out of a side of said elongated body, and
said combined function corresponds to said one or more surfaces of said first patterned region and said one or more surfaces of said second patterned region.

2. The apparatus of claim 1, wherein:
said first contact region is inside said guide hole adjacent a first opening of said guide hole in a first surface of said guide, and said second contact region is inside said guide hole adjacent a second opening of said guide hole in a second surface of said guide, and
said first surface is opposite said second surface.

3. The apparatus of claim 2, wherein there is a gap between said elongated body and an inner sidewall of said guide hole.

4. The apparatus of claim 1, wherein said one or more surfaces of said first patterned region comprise at least two contiguous curved surfaces.

5. The apparatus of claim 1, wherein said one or more surfaces of said first patterned region diverge from one or more sides of said elongated body.

6. The apparatus of claim 1, wherein at least one of said surfaces of said first patterned region is curved.

7. The apparatus of claim 1, wherein said one or more surfaces of said first patterned region comprise a sequence of surfaces that diverge in different directions from said side of said elongated body.

8. The apparatus of claim 1, wherein:
said lateral translation of said tip comprises translation of said tip in a first direction along said surface of said terminal followed by translation of said tip in a second direction along said surface of said terminal, and
said second direction is substantially opposite said first direction.

9. The apparatus of claim 1, wherein said probe further comprises a second tip at an opposite end of said elongated body.

10. The apparatus of claim 1, wherein:
a longest length of said elongated body and a direction of said force are oriented along an axis that is substantially vertical, and
said lateral translation of said tip is substantially horizontal.

11. A probe card assembly comprising:
a wiring substrate comprising an electrical interface to a tester for controlling testing of an electronic device under test (DUT);
a guide comprising guide holes; and
electrically conductive probes disposed to contact terminals of said DUT and electrically connected to said electrical interface,
wherein:
each said probe comprises a tip at an end of an elongated body disposed in a corresponding one of said guide holes,
said elongated body comprises a first patterned region that contacts and rides on a first contact region in said corresponding guide hole and a second patterned region that contacts and rides on a second contact region in said corresponding guide hole as said elongated body moves in said corresponding guide hole in response to a force of one of said terminals of said DUT against said tip, and
as said first patterned region rides on said first contact region and said second patterned region rides on said second contact region, said tip moves in a pattern that comprises lateral translation of said tip along a surface of said one of said terminals, wherein said lateral translation is a combined function of said first patterned region and said second patterned region;
wherein the first patterned region comprises at least one of a curved surface or two surfaces with a discontinuity between the two surfaces;
wherein the second patterned region comprises at least one of a curved surface or two surfaces with a discontinuity between the two surfaces;
wherein:
said first patterned region comprises one or more surfaces that extend into or out of a side of said elongated body,
said second patterned region comprises one or more surfaces that extend into or out of a side of said elongated body, and
said combined function corresponds to said one or more surfaces of said first patterned region and said one or more surfaces of said second patterned region.

12. The probe card assembly of claim 11, wherein for each said probe:
said first contact region is inside said corresponding guide hole adjacent a first opening of said corresponding guide hole in a first surface of said guide, and
said second contact region is inside said corresponding guide hole adjacent a second opening of said corresponding guide hole in a second surface of said guide, and said first surface is opposite said second surface.

13. The probe card assembly of claim 12, wherein there is a gap between said elongated body and an inner sidewall of said guide hole.

14. The probe card assembly of claim 11, wherein said one or more surfaces of said first patterned region comprise at least two contiguous curved surfaces.

15. The probe card assembly of claim 11, wherein for each said probe, said one or more surfaces of said first patterned region diverge from one or more sides of said elongated body of said probe.

16. The probe card assembly of claim 15, wherein at least one of said surfaces of said first patterned region is curved.

17. The probe card assembly of claim 11, wherein said one or more surfaces of said first patterned region comprise a sequence of surfaces that diverge in different directions from said side of said elongated body.

18. The probe card assembly of claim 11, wherein:
said lateral translation of said tip comprises translation of said tip in a first direction along said surface of said one of said terminals followed by translation of said tip in a second direction along said surface of said one of said terminals, and
said second direction is substantially opposite said first direction.

19. The probe card assembly of claim 11, wherein for each said probe:
a longest length of said elongated body and a direction of said force are along an axis that is substantially vertical, and
said lateral translation of said tip is substantially horizontal.

20. The apparatus of claim 2, wherein a pattern of said one or more surfaces of said first patterned region is substantially the same as a pattern of said one or more surfaces of said second patterned region.

21. The apparatus of claim 1, wherein said first patterned region and said second patterned region have substantially the same pattern.

22. The apparatus of claim 10, wherein:
a horizontal cross-section of said elongated body at said first patterned region comprises a contour that imparts rotation of said elongated body about said axis, and
as said first patterned region rides on said first contact region and said second patterned region rides on said second contact region, said tip moves in a pattern that comprises said lateral translation and said rotation.

23. The apparatus of claim 1, wherein said first patterned region comprises a contour that rotates said elongated body as said first patterned region rides on said first contact region.

24. The apparatus of claim 1, wherein:
a cross-sectional shape of said elongated body is polygonal;
said first patterned region is on a first side of said elongated body,
said second patterned region is on a second side of said elongated body, and
said first side and said second side are contiguous sides of said elongated body.

25. The probe card assembly of claim 12, wherein a pattern of said one or more surfaces of said first patterned region is substantially the same as a pattern of said one or more surfaces of said second patterned region.

26. The probe card assembly of claim 11, wherein said first patterned region and said second patterned region have substantially the same pattern.

27. The probe card assembly of claim 19, wherein:
a horizontal cross-section of said elongated body at said first patterned region comprises a contour that imparts rotation of said elongated body about said axis, and
as said first patterned region rides on said first contact region and said second patterned region rides on said second contact region, said tip moves in a pattern that comprises said lateral translation and said rotation.

28. The probe card assembly of claim 11, wherein said first patterned region comprises a contour that rotates said elongated body as said first patterned region rides on said first contact region.

29. The probe card assembly of claim 11, wherein:
a cross-sectional shape of said elongated body is polygonal;
said first patterned region is on a first side of said elongated body,
said second patterned region is on a second side of said elongated body, and
said first side and said second side are contiguous sides of said elongated body.

30. The apparatus of claim 1, wherein in an absence of said force on said tip:
a first portion of said elongated body extends away from a first opening of said guide hole in a first side of said guide, a second portion of said elongated body extends away from a second opening of said guide hole in a second side of said guide that is opposite said first side,
a middle portion of said elongated body between said first portion and said second portion is disposed inside said guide hole, and
there is a gap between said middle portion of said elongated body and said first opening of said guide hole sufficient so that said elongated body does not contact said first opening of said guide hole.

31. The probe card assembly of claim 11, wherein in an absence of said force on said tip:
a first portion of said elongated body extends away from a first opening of said guide hole in a first side of said guide, a second portion of said elongated body extends away from a second opening of said guide hole in a second side of said guide that is opposite said first side,
a middle portion of said elongated body between said first portion and said second portion is disposed inside said guide hole, and
there is a gap between said middle portion of said elongated body and said first opening of said guide hole sufficient so that said elongated body does not contact said first opening of said guide hole.

32. The apparatus of claim 1, wherein as said first patterned region rides on said first contact region and said second patterned region rides on said second contact region, said tip moves in said pattern that comprises said lateral translation without substantially twisting about said elongated body.

33. The apparatus of claim 1, wherein:
said first patterned region but not said second pattern region of said elongated body contacts and rides on said first contact region, and
said second patterned region but not said first pattern region of said elongated body contacts and rides on said second contact region.

34. The probe card assembly of claim 11, wherein as said first patterned region rides on said first contact region and said second patterned region rides on said second contact region, said tip moves in said pattern that comprises said lateral translation without substantially twisting about said elongated body.

35. The probe card assembly of claim 11, wherein:
said first patterned region but not said second pattern region of said elongated body contacts and rides on said first contact region, and
said second patterned region but not said first pattern region of said elongated body contacts and rides on said second contact region.

* * * * *